(12) United States Patent
Amo et al.

(10) Patent No.: US 7,687,823 B2
(45) Date of Patent: Mar. 30, 2010

(54) LIGHT-EMITTING APPARATUS AND METHOD OF PRODUCING THE SAME

(75) Inventors: Takahiro Amo, Anan (JP); Shinji Nishijima, Yokohama (JP); Satoshi Okada, Anan (JP); Yoshifumi Hodono, Yokohama (JP)

(73) Assignee: Nichia Corporation, Tokushima (JP)

( * ) Notice: Subject to any disclaimer, the term of this patent is extended or adjusted under 35 U.S.C. 154(b) by 49 days.

(21) Appl. No.: 11/963,250

(22) Filed: Dec. 21, 2007

(65) Prior Publication Data

US 2008/0149960 A1  Jun. 26, 2008

(30) Foreign Application Priority Data

Dec. 26, 2006 (JP) .............................. 2006-350079
Feb. 28, 2007 (JP) .............................. 2007-050109
Sep. 20, 2007 (JP) .............................. 2007-244433

(51) Int. Cl.
*H01L 33/00* (2010.01)

(52) U.S. Cl. ........................... 257/99; 257/98; 257/100; 257/E33.056; 257/E33.06; 257/E33.061; 438/27; 438/121; 438/122; 438/124; 438/127

(58) Field of Classification Search ................................ 257/E33.056–E33.061, 98–100; 438/27, 438/121–122, 124, 127
See application file for complete search history.

(56) References Cited

U.S. PATENT DOCUMENTS 5,869,883 A * 2/1999 Mehringer et al. .......... 257/667
6,924,514 B2 * 8/2005 Suenaga ...................... 257/98
7,301,175 B2 * 11/2007 Izuno et al. ................... 257/98
7,423,296 B2 * 9/2008 Chua ............................ 257/98
2003/0168720 A1 * 9/2003 Kamada ...................... 257/666
2003/0189830 A1 * 10/2003 Sugimoto et al. ........... 362/294
2004/0061433 A1 * 4/2004 Izuno et al. ................. 313/498
2004/0227145 A1 * 11/2004 Abe et al. ..................... 257/98
2005/0072981 A1 * 4/2005 Suenaga ...................... 257/88
2005/0173708 A1 * 8/2005 Suehiro et al. ............... 257/79
2006/0012299 A1 * 1/2006 Suehiro et al. .............. 313/512
2006/0049423 A1 * 3/2006 Yamaguchi et al. ......... 257/100
2006/0193121 A1 * 8/2006 Kamoshita ................... 362/84
2007/0014318 A1 * 1/2007 Hajjar et al. ................... 372/9
2008/0054279 A1 * 3/2008 Hussell et al. ................ 257/95

FOREIGN PATENT DOCUMENTS

JP    2000-150966    5/2000

(Continued)

*Primary Examiner*—Zandra Smith
*Assistant Examiner*—Jeremy J Joy
(74) *Attorney, Agent, or Firm*—Nixon & Vanderhye, PC

(57) ABSTRACT

A light-emitting apparatus includes a package including a support having a central section and a peripheral section around the central section. The central section is raised upwardly from the peripheral section, providing a pedestal for supporting a light-emitting device. A light-emitting device secured on an upper surface of the pedestal and has electrodes. Electrically conductive members are provided on a peripheral region of the package and electrically connected to the electrodes of the light-emitting device. A color conversion layer covers the light-emitting device. A light-transmitting member is formed in the package, sealing at least the light-emitting device together with the color conversion layer. The pedestal has its side surface at least partially exposed from the color conversion layer.

19 Claims, 4 Drawing Sheets

FOREIGN PATENT DOCUMENTS

| | | |
|---|---|---|
| JP | 2000-223750 | 8/2000 |
| JP | 2000-315824 | 11/2000 |
| JP | 2003-318448 | 11/2003 |
| JP | 2006-245020 | 9/2006 |
| WO | WO 2007015606 A1 * | 2/2007 |

* cited by examiner

LIGHT-EMITTING APPARATUS AND METHOD OF PRODUCING THE SAME

CROSS-REFERENCE TO RELATED APPLICATIONS

This application is based upon and claims the benefit of priority from prior Japanese Patent Applications No. 2006-350079, filed Dec. 26, 2006; No. 2007-050109, filed Feb. 28, 2007; and No. 2007-244433, filed Sep. 20, 2007, the entire contents of all of which are Incorporated herein by reference.

BACKGROUND OF THE INVENTION

1. Field of the Invention

The present invention relates to a light-emitting apparatus and a method of producing the same, and more particularly, to a light-emitting apparatus in which an outputted light of a light-emitting device is converted in wavelength by a color conversion layer, and a method of producing the same.

2. Description of the Related Art

Conventionally, a light-emitting apparatus is known which comprises a package having a bottom and a side wall portion surrounding the bottom so as to define a cup with the bottom. A light-emitting device is contained in the cup, and a light-transmitting member containing a phosphor material which converts, in wavelength, the outputted light of an LED chip is filled in the cup.

In producing such an apparatus, the LED chip is mounted on the bottom of the cup, and then the light-transmitting member containing the phosphor material is filled in the cup. The phosphor material is settled onto the LED chip and onto the bottom of the cup (see FIG. 1 of Jpn. Pat. Appln. KOKAI Publication No. 2006-245020) Alternatively, the phosphor material is spray-coated on the LED chip (see FIG. 5 of Jpn. Pat. Appln. KOKAI Publication No. 2003-318448). Incidentally, as shown in FIG. 1 of Jpn. Pat. Appln. KOKAI Publication No. 2006-245020, the distance from the lower edge of the LED chip to the inner surface of the side wall portion is made large, since a metallic thin wire is connected by bonding to the LED chip and to a wiring pattern formed at the peripheral region around the secured portion of the LED chip on the bottom of the cup, electrically connecting the LED chip and the wiring pattern.

In such a light-emitting apparatus, some of the outputted light of the LED chip, for example, a blue LED is converted into a yellow light by the phosphor material (e.g., YAG), and a white light, which is a mixed color of the blue light and the yellow lights is outputted from the light-emitting apparatus. The conversion amount of the outputted light of the LED chip depends on the distance from the lower edge of the LED chip to the inner surface of the side wall portion.

If the distance from the lower edge of the LED chip to the inner surface of the side wall portion is made large as described above, the light extraction efficiency is lowered. Namely, since the outputted light of the light-emitting device is emitted through the color conversion layer, and some of the light is reflected or absorbed at the bottom of the cup, the light extraction efficiency is lowered.

Further, if the distance from the lower edge of the LED chip to the inner surface of the side wall portion is made large, color irregularity in the outputted light becomes large when the LED chip is mounted at a position offset from the predetermined position. In other words, when the LED chip is mounted at a position offset from the predetermined position, the amount of the phosphor material around the LED chip becomes uneven, leading to different conversion amount of the light emitted from the light-emitting device according to location, resulting in large color non-uniformity.

In addition, the longer the distance from the lower edge of the LED chip to the inner surface of the side wall portion, or the larger the amount of the phosphor material on the region from the lower edge of the LED chip to the inner surface of the side wall portion, the more the blue light from the light emitting device is converted into yellow. The resulting light is significantly different in color from the light emitted from the region where the amount of YAG is small (e.g., the upper surface of the LED chip).

On the other hand, when the light-emitting apparatus is mounted on a circuit board at a high density, the parts of the apparatus is deteriorated or failed due to the heat generated when the light-emitting device emits light. Thus, a light-emitting apparatus superior in heat releasing property and suitable for high density mounting is desired.

BRIEF SUMMARY OF THE INVENTION

It is an object of the present invention to provide a light-emitting apparatus having an improved light extraction efficiency, and small color irregularity in the outputted light even if a light-emitting device is mounted offset from the desired position, and a method of producing the same.

According to a first aspect of the present invention, there is provided a light-emitting apparatus comprising: a package comprising a support having a central section and a peripheral section around the central section, the central section being raised upwardly from the peripheral section, providing a pedestal for supporting a light-emitting device; a light-emitting device secured on an upper surface of the pedestal and having electrodes; electrically conductive members provided on a peripheral region of the package and electrically connected to the electrodes of the light-emitting device; a color conversion layer covering the light-emitting device; and a light-transmitting member formed in the package, sealing at least the light-emitting device together with the color conversion layer; wherein the pedestal has its side surface at least partially exposed from the color conversion layer.

The color conversion layer is preferably is deposited substantially uniformly on the light-emitting device and on the peripheral section. The color conversion layer may comprise a portion of phosphor material which has been contained in the light-transmitting member and settled onto the light-emitting device. Alternatively, the color conversion layer is locally formed on the pedestal including the light-emitting device.

Further, the color conversion layer may comprise a mixture of a phosphor material effecting the color conversion and a light-diffusing additive. In this case, the phosphor material and the light-diffusing additive is preferably uniformly mixed. The color conversion layer and a layer of the light-diffusing additive may be stacked one on the other. In this case, it is preferable that the color conversion layer is placed on the layer of the light-diffusing additive.

When the light-emitting device is secured by a die-bonding member, it is preferable that the die-bonding member covers a covering region extending from a lower edge of a side surface of the light-emitting device upwardly on a side surface of the device up to a position immediately below a position where a light-emitting layer of the light-emitting device is exposed. In this case, the color conversion layer covers a side surface of the device above the covering region, and also a side surface of the light-emitting layer.

A central region of the upper surface of the pedestal may be recessed, the light-emitting device may be placed in the recess, and the color conversion layer may be deposited thicker on the side surface of the light-emitting device than on the upper surface of the light-emitting device. The recess preferably has a depth such that a light-emitting layer of the light-emitting device is positioned higher than the upper surface of the pedestal.

The light-transmitting member may have a first portion containing a phosphor material covering the light-emitting device on the upper surface of the pedestal, and a second portion covering the first portion.

The package may include an insulating substrate having a central through-hole therein, and the support is inserted into the through-hole and is made of a metallic material.

According to a second aspect of the present invention, there is provided a method of producing a light-emitting apparatus, the apparatus comprising a package comprising a support having a central section and a peripheral section around the central section, the central section being raised upwardly from the peripheral section, providing a pedestal for supporting a light-emitting device; a light-emitting device secured on an upper surface of the pedestal and having electrodes; electrically conductive members provided on a peripheral region of the package and electrically connected to the electrodes of the light-emitting device; a color conversion layer covering the light-emitting device; and a light-transmitting member formed in the package, sealing at least the light-emitting device together with the color conversion layer, the method comprising depositing a phosphor material which has been contained in the light-transmitting member by settling down the phosphor material onto the pedestal, forming the color conversion layer, such that the color conversion layer is discontinued at a step between the upper surface of the pedestal and the upper surface of the peripheral section, thereby exposing a portion of the side surface of the pedestal exposed from the color conversion layer.

DETAILED DESCRIPTION OF THE INVENTION

Figure 1:
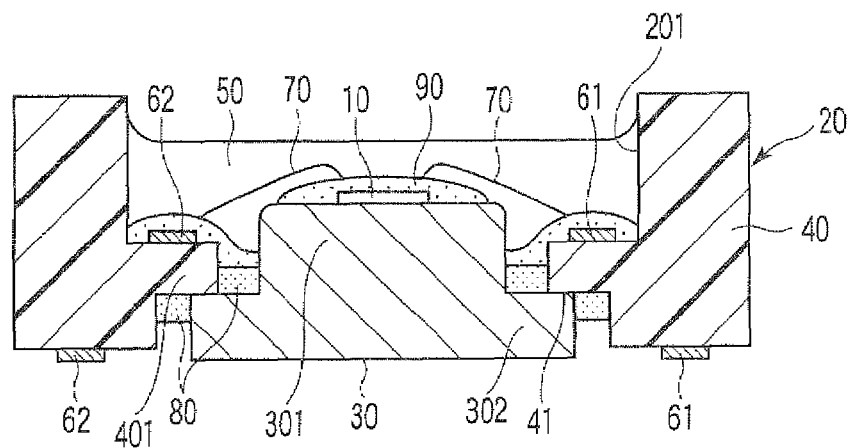
FIG. 1 illustrates a side sectional view schematically illustrating a light-emitting apparatus according to a first embodiment of the present invention.

Embodiments of the present invention will be described below with reference to the drawings. It should be noted that the following embodiments exemplify a light-emitting apparatus embodying the technical idea of the present invention and the present invention should not be limited thereto. Further, the description herein is not intended to restrict the members or elements recited in the claims to those described in the embodiments. In particular, the sizes, materials, shapes and relative arrangements of the members or elements described in the embodiments are not intended to restrict the claims thereto and are only illustrative examples. The sizes and positional relationships of the members in the drawings are sometimes shown exaggerated. In the following description, the same names and reference symbols denote the same or similar elements, and their detailed explanation may be omitted in the subsequent description. Further, a plurality of elements constituting the present invention may be constituted by one and the same member, which exhibits the functions of the plurality of elements, or conversely, the functions of one member may be shared by a plurality of members.

First Embodiment

Figure 2:
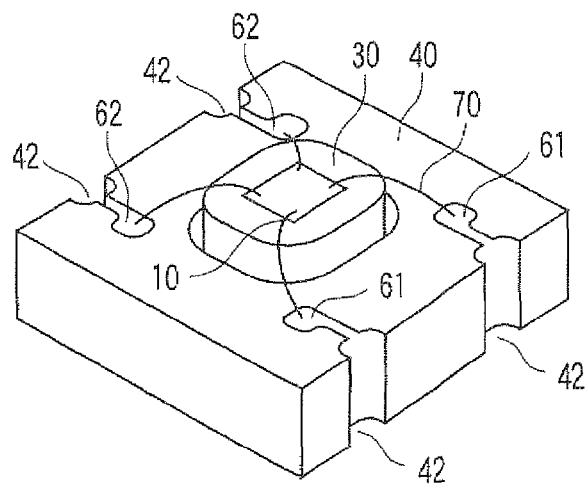
FIG. 2 is an oblique view of the apparatus of FIG. 1 with the cup of the package, the color conversion layer and the light-transmitting sealing member omitted.
Figure 3:
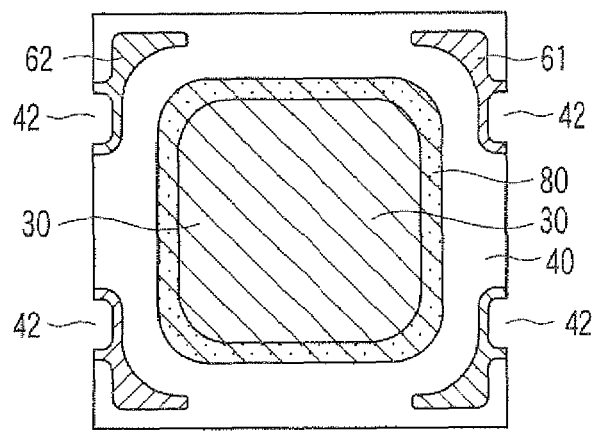
FIG. 3 is a back side view showing the lower bottom surface of the light-emitting apparatus of FIG. 1.
Figure 4:
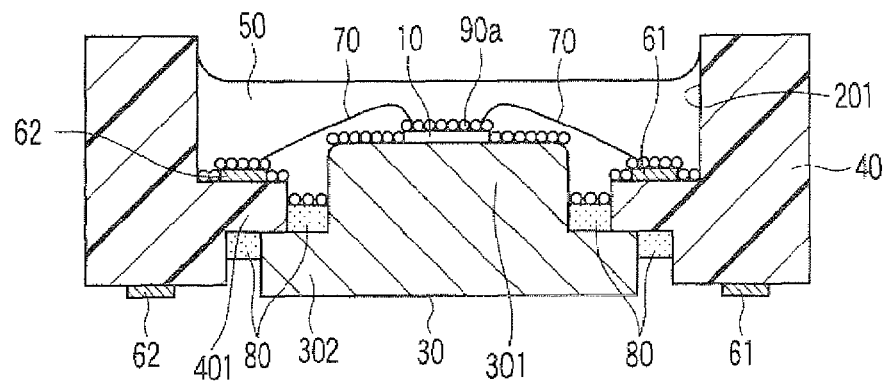
FIG. 4 is an enlarged view schematically illustrating the distribution of the color conversion layer on the bottom of the cup including the pedestal, of FIG. 1.

FIG. 1 is a side sectional view schematically illustrating a light-emitting apparatus according to a first embodiment of the present invention. FIG. 2 is an oblique view of the apparatus of FIG. 1 with a cup of the package, a color conversion layer and a light-transmitting member omitted. FIG. 3 is a back side view showing a lower bottom surface of the light-emitting apparatus of FIG. 1. FIG. 4 is an enlarged view schematically illustrating the distribution of the color conversion layer on the bottom of the cup, including the pedestal, of FIG. 1.

A light-emitting apparatus 10 illustrated in FIGS. 1 to 4 comprises a package 20 which includes a support 30 having a central section 301 and a peripheral section 302 around the central section 301. The support 30 provides a bottom of the package 20. A side wall 40 surrounds the bottom 30 to define a cup 201 together with the bottom. The central section 301 is raised upwardly higher than the peripheral section 302, providing a pedestal for a light-emitting device. A light-emitting device 10 is secured on the central region of the upper surface of the pedestal 301 by a die bonding member (not shown). A color conversion layer 90 is formed on the pedestal 301, covering the light-emitting device 10. On the peripheral region of the bottom surface of the cup 201, electrically conductive member 61 and 62 are formed, and the conductive members 61 and 62 are electrically connected to the electrodes of the light-emitting device 10. In this embodiment, the electrodes of the light-emitting device 10 and the conductive members 61 and 62 are connected by metallic thin wires (bonding wires) 70. A light-transmitting member 50 is filled in the cup 201 down to the bottom surface of the cup 201, sealing the light-emitting device 10 on the pedestal 301 and at least portions of the metallic thin wires 70.

The light-emitting device 10 may be a blue LED chip, and the color conversion layer 90 may be formed of particles of YAG 90a which is a phosphor material (see FIG. 4). In this embodiment, the YAG particles 90a forms the color conversion layer 90 are a portion of YAG particles which have been contained in the light-transmitting member 50 before the member 50 is filled in the cup 201 and settled down onto the light-emitting device 10, etc., after the member 50 is filled in the cup 201. It should be noted that the color conversion layer 90 is discontinued at the step between the upper surface of the pedestal 301 and the upper surface of the peripheral section 302 of the bottom 30. In other words, the pedestal 301 has a portion exposed from the color conversion layer 90. On the pedestal 301, the YAG particles 90a are uniformly deposited on the blue light-emitting device 10 and on the peripheral region of the device 10.

In this embodiment, the bottom 30 of the package 20, or the support 30, is made of a metallic material, thus providing a heat sink. The side wall 40 is provided by an insulating substrate, which has a substantially square planar shape, and is provided with a through-hole penetrating the central region of the substrate in its thickness direction. The metallic support 30 is inserted into the through-hole of the substrate as shown in FIG. 1. The metallic support 30 and the substrate 40 are bonded by adhesives 80. The YAG particles 90a also cover the adhesive 80 on the metallic support 30.

In this embodiment, the substrate 40 has four grooves 42 extending vertically in its side surfaces, with two grooves in one side surface of the substrate 40, and the other two grooves in the opposed side surface of the substrate 201. In addition, the substrate 40 has electrically conductive members 61 and 62 formed on the substrate. On the lower surface side of the substrate 30, the lower surface of the conductive members 61 and 62 are substantially flush with the lower surface of the support 30.

In the first embodiment described above, some of the outputted light of the blue LED chip 10 is converted into yellow color by the YAG 90a on the pedestal 301, and white light, which is mixed color of the blue and yellow lights, is outputted from the light-emitting apparatus. The conversion amount of the blue light is dependent on the amount of YAG present on a region between the lower edges of the device 10 and the periphery of the pedestal 301.

As noted above, the color conversion layer 90 is discontinued at the step between the upper surface of the pedestal 301 and upper surface of the peripheral section 302 of the support 30, i.e., the pedestal 301 has a portion exposed from the color conversion layer 90. Thus, the light reflected and absorbed at the peripheral region of the bottom surface of the cup 201 can be largely decreased, improving the light extraction efficiency.

Further, if the mounting position of the LED chip 10 is somewhat deviated from the desired central position, the difference in amount of the YAG around the LED chip 10 according to location on the pedestal is small, and thus the difference in amount of the light from the chip 10 converted by the YAG around the chip 10 according to location is small, resulting in a small color non-uniformity. As a result, a high quality light-emitting apparatus can be realized.

In addition, since the amount of YAG around the LED chip 10 on the pedestal 301 is small, the blue light emitted from the LED chip 10 is not so strongly converted into yellow light, providing a uniform mixed color (white light).

Further, the metallic support 30 serves as a heat sink as noted above, and thus, the heat can be effectively removed out of the package 20.

The constituents of the apparatus of the first embodiment will be described in more detail below.

Insulating Substrate 40

As noted above, the Insulating substrate 40 provides the side wall of the package 20. The substrate 40 is a thin rectangular parallelepiped having a substantially square planar shape, and has a through-hole in the central region. The through-hole has a substantially square planar shape with the four corners rounded. The inner wall of the substrate 40 that defines the through-hole has annular ledge 401 protruding from a lower portion of the inner wall of the substrate 40. The planar shape of the through-hole may be circular, elliptic or polygonal, and is preferably similar to the upper surface of the pedestal 30. As mentioned previously, the substrate 40 has four grooves 42 extending vertically in its opposed side surfaces.

As the insulating substrate, use may be made of a resin substrate, a hybrid substrate formed of an organic material containing an inorganic material, such as a glass-epoxy, or an inorganic substrate such as a ceramic substrate. In particular, when high heat resistance and/or high light fastness is desired, it is preferable to use a hybrid substrate or an inorganic substrate.

A plurality of light-emitting apparatuses according to this embodiment can be produced at low cost by fabricating a plurality of apparatuses using a single insulating substrate, a plurality of devices 10, etch, and dividing the substrate into individual apparatuses. When a light-emitting apparatus for which a high contrast is required is produced, a dark color insulating substrate is preferably used. Such a dark color substrate can be provided by incorporating, for example, $Cr_2O_3$, $MnO_2$, $TiO_2$ or $Fe_2O_3$ into the insulating substrate.

The ceramic substrate preferably contains alumina, aluminum nitride or mullite as a base material. A sintering aid, for example, is added to the base material, and the mixture is sintered to prepare the ceramic substrate. For example, a ceramic substrate can be prepared by sintering a mixture of 90 to 96% by weight of alumina powder and 4 to 10% by weight of a sintering aid powder such as clay, talc, magnesia and/or silica at a temperature of 1500 to 1700° C., or by sintering a mixture of 40 to 60% by weight of alumina powder and 60 to 40% by weight of a sintering aid powder such as borosilicate glass, cordierite, forsterite and/or mullite at a temperature of 800 to 1200° C.

Such a ceramic substrate can have a variety of shapes in the green sheet state before sintering. First, a green sheet which is a sheet of material of the ceramic substrate before sintering is worked to have the through-hole and grooves 42. A plurality of green sheets may be laminated, if necessary. Then, the conductive members 61 and 62 is formed by a suitable method such as a screen printing, using a paste of a mixture of a resin hinder and a high melting metal powder such as tungsten or molybdenum contained in the resin binder. The resulting green sheet or laminated sheets are sintered to prepare an insulating substrate having the through-hole, grooves 42 and conductive members 61 and 62.

As mentioned previously, the inner wall of the substrate 40 that defines the through hole has the annular ledge 401. Such a substrate may be prepared by laminating a plurality of substrates (three in the case of FIG. 1) having through-holes therein that differ in size. The lower surface of the ledge 401 abuts on and bonded to the upper surface of the peripheral section 302 of the bottom 30 of the package 20 (see FIG. 1). When the through-hole of the uppermost substrate of the laminated substrate structure is formed to increase in width upwardly, and the through-hole of the lowermost substrate to increase in width downwardly, the distance between the conductive member 61, 62 and the side surface of the pedestal 301 becomes large, thus proving a more miniaturized light-emitting apparatus with good yields. The formation of the through-hole increasing in its size in the direction of the thickness of the substrate can be effected by using a cutting tool having a blade correspondingly decreasing in width. Alternatively, the through-hole increasing in its size in the direction of the thickness can be made by cutting a substrate using a cutting tool while the contact angle of the cutting tool is changed. Further, a plurality of substrates having central through-holes differing in size can be laminated in ascending or descending order of the hole size, providing a laminated substrate structure having a step-like inner wall defining a through-hole. Then, the step or steps are smoothened by forcing a mold against the step or steps, thereby forming a tapered through-hole in the laminated substrate structure.

The grooves 42 extend from the upper surface of the substrate to the lower surface of the substrate. The grooves 42 have a rectangular shape in plane with the inner corners rounded. The conductive members 61 and 62 formed on the upper surface of the ledge 401 and the lower surface of the substrate 40 extend into the grooves 42. With such a construction, electrical connection can be made at the inside of the grooves, enhancing mountability of the apparatus.

Metallic Support 30

The metallic support 30 is inserted in the through-hole of the substrate 40, and the light-emitting device 10 is placed on its upper surface. The uppermost surface of the metallic support 30 is positioned higher than the upper surface of the ledge 401. It is preferable that the distance between the uppermost surface of the metallic support 30 and the upper surface of the ledge 401 is 0.05 mm or more, more preferably 0.1 mm or more. Further, it is preferable that the side surface of the ledge 401 is spaced apart from the peripheral surface of the pedestal 301, forming a recess. Such a construction can separate the color conversion layer 90 at the recess. Also, when the lower surfaces of the conductive members 61 and 62 are substantially flush with the lower surface of the metallic support 30, on the lower surface side of the substrate, both the lower surface of the conductive members 61 and 62 and the lower surface of the metallic support 30 can be brought into contact with a printed circuit board on which the light-emitting apparatus is to be mounted, and thus the heat generated on the light-emitting apparatus can be effectively removed through the circuit board. Furthermore, it is preferable that side surface of the peripheral section 302 of the metallic support 30 is spaced apart from the inner surface of the side wall 40, forming a recess. When the light-emitting apparatus is mounted on a printed circuit board using a solder, the solder can be let out into the recess, preventing the conductive members 61 and 62 from short-circuiting.

It is preferable that the metallic support 30 and the side wall 40 are not entirely bonded, but partially bonded as illustrated in FIG. 1. The partial bonding of the metallic support 30 and the side wall 40 can suppress the loss of the integrality of the members due to thermal stress. The metallic support 30 is not particularly limited, as long as it has a thickness and a size which result in a sufficient removal of heat therefrom. As can be seen from the description above, the lower surface area of the peripheral section 302 of the support 30 is larger that the upper surface area of the pedestal 301. Thus, the heat generated on the upper surface of the pedestal 301 by the light-emitting device 10 and transferred to the metallic support 30 can be efficiently conducted to the lower surface of the peripheral section 302 of the support 30. Incidentally, the metallic support 30 is formed of a metallic material as mentioned above. The metallic material comprises a metal superior in heat conductivity. For example, the metallic support 30 may be formed of copper, aluminum or magnesium. It is desirable that a substantial number of small protrusions (not shown) are formed on the upper surface of the pedestal 301 in order to increase the contact area with the die-bonding member (adhesive).

Adhesive 80

The adhesive 80 is not particularly limited as long as it can firmly bond the metallic support 30 with the substrate 40. However, if the adhesive 80 contains the same material as the main component of the metallic support 30, bonding strength can be enhanced, and residual stress due to the thermal expansion difference between the insulating substrate and the metallic support 30 can be alleviated. In particular, when a ceramic substrate, which is superior in heat resistance, is used, the metallic support 30 and the substrate can be bonded together by hard solder bonding or eutectic bonding. For example, a silver solder comprising an alloy of silver with copper as a main component, a brass solder comprising an alloy of copper and zinc as a main component, an aluminum solder comprising aluminum as a main component, or a nickel solder comprising nickel as a main component may be used.

Electrically Conductive Members 61 and 62

The electrically conductive members 61 and 62 serve as cathode and anode electrodes, respectively, and are formed extending from the upper surface of the ledge 401 to the lower surface of the side wall 40 through the grooves 42. The pattern of the conductive members 61 and 62 may vary dependent on the number, kind and/or size of light-emitting device. The material for the conductive members is not particularly limited, as long as it has an electrical conductivity. It is preferable for the conductive material to have a high electrical conductivity. Examples of such a conductive material include tungsten, chromium, titanium, cobalt, molybdenum and an alloy thereof. It is preferable that the uppermost surface of the conductive members is covered with a member having a high reflectivity with respect to the light from the light-emitting device. Further, it is preferable that the major proportion of each of the conductive members 61 and 62 are covered by the light-transmitting member 50. Such a construction can suppress the deterioration of the light-emitting apparatus. Moreover, it is preferable that those portions of the surfaces of the conductive members 61 and 62 which are not covered by the light-transmitting member 50 are provided with antioxidant film.

As mentioned above, the cathode and anode electrodes 61 and 62 extend from the upper surface of the ledge to the lower surface of the side wall 40 through the grooves 42. Those portions of the electrodes 61 and 62 which are placed on the lower surface of the side wall 40 are directed from the grooves 42 toward the corners of the lower surface of the side wall 40, enlarging their areas (see FIG. 3).

This arrangement can prevent a solder used to mount the light-emitting apparatus on a printed circuit board (not shown) from flowing toward the metallic support 30 to be short-circuited, realizing a high reliability mounting. In this embodiment, two separate cathode electrodes 61 and two separate anode electrodes 62 are formed. However, two electrodes 61 can be connected with each other on the lower surface of the side wall, and two electrodes 62 can also be connected with each other on the lower surface of the side wall, thereby providing one cathode electrode 61, and one anode electrode 62.

Since the upper surface of the pedestal 301 protrudes from the upper surface of the ledge 401 as described above, the light from the light-emitting device 10 can be efficiently extracted to the outside. However, when the light-emitting device 10, the metallic support 30, etc., are sealed by the light-transmitting member 50, thermal stresses, which are generated in the light-transmitting member 50 during manufacture or light emitting, tends to concentrate on the light-emitting device 10, and the bonds between the light-emitting device 10 and the other members may be broken. To avoid this, the angle formed between the upper surface of the pedestal 301 and the peripheral surface of the light-transmitting member 50 is preferably 90 degrees or less. Further, the half-range angle of the light from the thusly formed light-transmitting member to the outside is preferably larger than 90 degrees. Thereby, uniform light is outputted outside in a wide range, and the light extraction efficiency is improved, thus making it possible to suppress an increase in temperature of the light-emitting apparatus.

Light-Emitting Device 10

As the light-emitting device 10, use may be made of a device having a semiconductor such as GaAlN, ZnS, ZnSe, SiC, GaP, GaAlAs, AlN, InN, AlInGaP, InGaN, GaN or AlInGaN as a light-emitting layer (not shown) formed on a substrate. The device may be of a home structure, a hetero structure or a double-hetero structure, having a MIS, PIN or PN junction. The emission wavelength may vary from ultraviolet to infrared by appropriately selecting the materials or the compositions thereof used for the light-emitting layer. The light-emitting layer may be of a single quantum well structure or a multiple quantum well structure, generating quantum effect.

When the light-emitting apparatus is used outdoors, it is preferable to use gallium nitride-based semiconductor materials, which are capable of producing high luminance light-emitting devices. In the red light-emitting device, it is preferable to use gallium aluminum arsenide or aluminum indium gallium phosphide semiconductor materials, but any other semiconductor materials may be used depending on applications. When a gallium nitride-based semiconductor material is used, sapphire, spinel, SiC, Sir ZnO or GaN single crystal is used as the material for the substrate. In order to form gallium nitride of a good crystal quality with good mass productivity, it is preferable to use a sapphire substrate.

A plurality of light-emitting devices may be used as desired, and a variety of light-emitting apparatus can be realized by appropriately combining the emission colors of the light-emitting device and arranging the light-emitting device. For example, a dot matrix arrangement or a linear arrangement may be used, thereby obtaining a light-emitting apparatus having a very high packaging density and excellent heat removing property. When the apparatus is used as a full-color light-emitting apparatus for a display device, it is preferable to combine a red light-emitting device having an emission wavelength of 610 nm to 700 nm, a green light-emitting device having an emission wavelength of 495 nm to 565 nm, and a blue light-emitting device having an emission wavelength of 430 nm to 490 nm.

Further, in order for the light-emitting apparatus to output mixed-color light such as white light by using a phosphor material, the emission wavelength of the light-emitting device is preferably 400 nm or more and 530 nm or less, more preferably 420 nm or more and 490 nm or less, taking the complementary color relationship with the emission wavelength of the phosphor material and deterioration of the light-transmitting resin into consideration. In order to further improve the excitation of the light-emitting device and the phosphor material, and to improve the emission efficiency, the emission wavelength of the light-emitting device is more preferably 450 nm or more and 475 nm or less. An LED having a main emission wavelength in the ultraviolet region shorter than 400 nm, or in the short wavelength region of the visible light may be used, when combined with the materials which are relatively hardly deteriorated by the ultraviolet ray. Further, the light-emitting device 10 can be secured on the pedestal by means of a support with an electrically conductive member formed on its surface or of an auxiliary member called sub-mounting.

Die-Bonding Member

The die-bonding member secures the light-emitting device 10 on the pedestal 301, and is not particularly limited as long as it can bond the device and pedestal 301. In view of good heat removal, the die-bonding member is preferably formed of a Ag paste, a carbon paste, an ITO paste or a metallic bump. In the case of high power light-emitting device having high caloric power, it is preferable to use an eutectic solder such as Au—Sn, which has a high melting point, thus does not change in texture at a high temperature and is small in decrease of kinetic properties. The die-bonding member can suppress confinement of the light from the light-emitting device within the device due to the total reflection of the light emitting from the lower surface of the light-emitting device. This suppression of the light increases the light extraction efficiency, and also suppresses an increase in temperature of the light-emitting device.

Light-Transmitting Member 50

The light-transmitting member 50 is filled in the cup 201 of the package 20 to seal the light-emitting device 10r protecting the light-emitting device 10 from the external force exerted from the external environment, and from moisture. In addition the light-transmitting member 50 effectively conducts the mixed light to the outside. Such a light-transmitting member 50 may be suitably formed of a transparent resin excellent in light fastness such as an epoxy resin, a urea resin, a silicone resin, a modified epoxy resin, a modified silicone resin or an imide resin, or of glass. When the various elements including the light-emitting device is fabricated at a high density, an epoxy resin, a silicone resin or a combination thereof is preferably used in order to suppress the breakage of the bonds between the various elements due to thermal shock. Further, the light-transmitting member 50 may contain a light-diffusing additive to widen the field of view. Suitable examples of the light-diffusing additive include barium titanate, titanium oxide, aluminum oxide or silicon oxide or in order to diffuse the light from the semiconductor light-emitting device. Also, the light-transmitting member 50 may contain a colorant such as a dye or pigment to cut the unwanted wavelengths.

The light-transmitting member 50 is preferably formed of a silicone resin or a modified silicone resin, which is superior in heat resistance and light fastness and is hardly subject to color changes even when exposed to a high energy light of short wavelength including ultraviolet rays. These resins can suppress the color irregularities.

Color Conversion Layer 90 and Phosphor Material

The color conversion layer 90 converts some of the light from the light-emitting device 10 into the other color. It is preferable for the color conversion layer 90 to convert the light from the light-emitting device 10 into a light of longer wavelengths. When the color conversion layer is formed of a phosphor material, the phosphor material may be a material which is excited by the light from the light-emitting device to emit light in yellow, red, green or blue color region. In addition, use may also be made of a phosphor material which has emission spectrum in the intermediate color region of yellow, blue green or orange. Various light-emitting apparatus can be prepared by using the various phosphor materials.

When the light from the light-emitting device 10 is visible light of shorter wavelengths having a high energy, the color conversion layer 90 is preferably formed of an aluminum oxide phosphor material such as YAG phosphor represented by a composition formula: $Y_3Al_5O_{12}$:Ce, $(Y_{0.8}Gd_{0.2})_3Al_5O_{12}$:Ce, $Y_3(Al_{0.8}Ga_{0.2})O_{12}$:Ce or $(Y, Gd)_3(Al, Ga)_5O_{12}$ or $(Y, Gd)_3(Al, Ga)_5O_{12}$ or of $Ca_2Si_5N_8$ phosphor. In particular, YAG:Ce phosphor absorbs some of the blue light emitted from the blue LED by adjusting its content to emit yellow light which is complementary to the blue light, resulting in easy formation of a high output light-emitting apparatus emitting a mixed light of white. For example, the blue light from a blue light-emitting device having a GaN-based compound semiconductor as an active layer is made incident on $Y_3Al_5O_{12}$:Ce or $(Y_{0.8}Gd_{0.2})_3Al_5O_{12}$:Ce phosphor, which then converts some of the blue light into yellow light. The blue light of the blue light-emitting device 10 and the yellow from the phosphor are mixed to give white light, which is outputted from the light-emitting apparatus.

Other Constituents

The light-emitting apparatus of the present invention is additionally provided with a Zener diode as a protective element for the LED chip 10. In this case, the Zener diode may be placed on the conductive member 61 or 62, or the LED 10 may be placed on the Zener diode. A recess may be formed on the upper surface of the ledge 401 to mount the Zener diode.

Metallic Thin Wires 70

The metallic thin wires 70 electrically connect the light-emitting device 10 and the conductive members 61, 62. It is preferable that the metallic thin wires 70 exhibit good ohmic contact with the electrodes of the light-emitting device 10, good mechanical connectability, good electrical conductivity and good heat conductivity. It is preferable that the heat conductivity is 0.01 cal/s·cm² (° C./cm²) or more, more preferably 0.5 cal/s·cm² (° C./cm²).

Second Embodiment

Figure 5A:
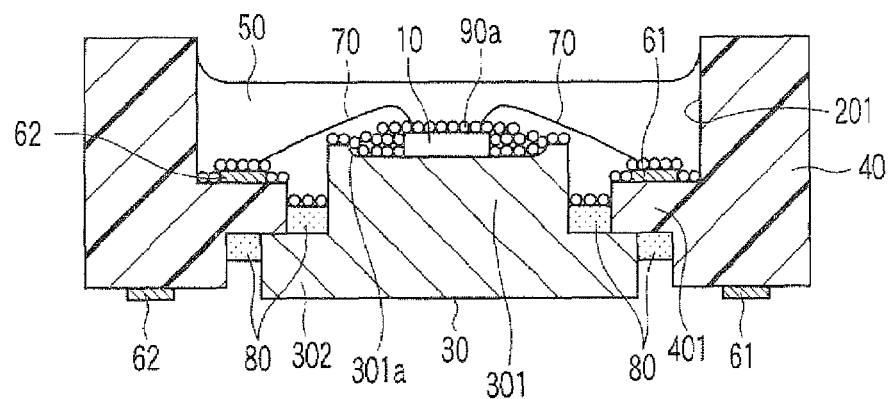
FIG. 5A is a side sectional view schematically illustrating a light-emitting apparatus according to a second embodiment of the present invention.
Figure 5B:
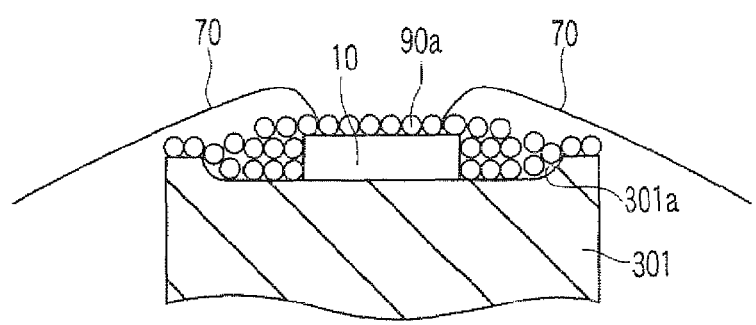
FIG. 5B is an enlarged view partially illustrating a pedestal in FIG. 5B, on which the light-emitting device is mounted, with a color conversion layer covering the upper surface of the pedestal, including the surface of the light-emitting device.

FIG. 5A is a side sectional view schematically illustrating a light-emitting apparatus according to a second embodiment of the present invention, and FIG. 5B is an enlarged view partially illustrating the pedestal on which the light-emitting device is mounted, with a color conversion layer covering the upper surface of the pedestal, including the surface of the light-emitting device. The light-emitting apparatus illustrated in FIGS. 5A and 5B is of the same construction as the construction of the apparatus according to the first embodiment, except that the central region of the upper surface of the pedestal 301 is recessed. The light-emitting device 10 is placed in the recess 301a. In this case, the phosphor particles 90a can be deposited thicker on the bottom surface of the recess 301a than on the upper surface of the light-emitting device 10. In other words, the phosphor particles 90a can be deposited to cover the entire side surfaces of the light-emitting device 10 in the recess 301a. The coverage of the entire side surfaces by the phosphor particles can solve the prior art problem that the light emitted from the side surfaces of the light-emitting device 10 is outputted outside the light-emitting apparatus without being converted in wavelength, which is one of the causes of the color irregularities.

Further, the recess 301a is preferably tapered toward the bottom. The tapered recess allows the phosphor particles to cover the light-emitting device 10 up to the light-emitting layer of the device 10 from the bottom of the recess 301a.

In one embodiment, the central recess 301a has such a depth that the light-emitting layer of the device 10 placed on the bottom of the recess 301a is positioned above the uppermost surface of the pedestal 301. The depth may be half the thickness of the light-emitting device 10. This construction allows the light from the light-emitting device 10 to distribute in a wider range.

Third Embodiment

Figure 6:
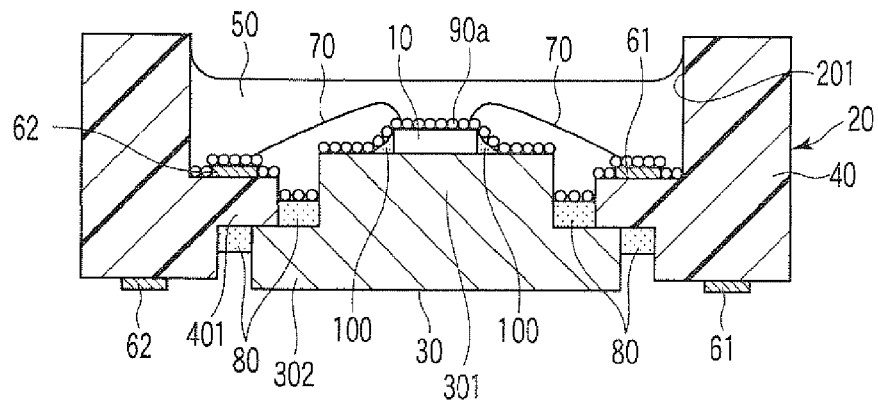
FIG. 6 is a side sectional view schematically illustrating a light-emitting apparatus according to a third embodiment of the present invention.

FIG. 6 is a side sectional view schematically illustrating a light-emitting apparatus according to a third embodiment of the present invention. The light-emitting apparatus according to the third embodiment is of the same construction as the construction of the apparatus according to the first embodiment, except that a die bonding member 100 securing the LED chip 10 on the pedestal 301 covers that region of the side surface of the LED chip 10 which corresponds to half to less than the height of the side surface of the LED chip 10. For example, a resin fillet surface is formed on the side surface of the LED chip 10.

The position of the light-emitting layer of the LED chip 10 varies dependent on the kind of the LED chip. However, in usual LED chips, the light-emitting layer is exposed at the side surface of the LED chip at a position half or more the height of the side surface of the LED chip. In this embodiment, the die bonding member 100 extends from the lower edge of the chip to the position on the side surface at a height at least half the height of the side surface.

In other words, it is preferable that the die bonding member 100 used to secure the LED chip 10 on the pedestal 301 extends from the lower edge of the side surface of the LED chip 10 upwardly on the side surface up to a position immediately below the position where the light-emitting layer of the LED chip 10 is exposed. The exposed portion of the side surface of the LED chip 10 is covered by the phosphor particles 90a.

In the construction noted above, the phosphor particles 90a can be deposited (e.g., settled down) on the upper surface of the pedestal 301 including the entire surfaces of the LED chip 10 without discontinuation at the upper edges of the LED chip 10 even if the amount of the phosphor particles is decreased. As a result, the color of the light emitting from the LED chip 10 is continuously converted by the continuously deposited phosphor particles 90a, making it possible to obtain a uniform outputted light without color irregularity. Incidentally, the die bonding member 100 is preferably light-transmissive without shielding the light emitted from the side face of the light-emitting layer, improving the emission efficiency.

Fourth Embodiment

A light-emitting apparatus according to a fourth embodiment is of the same construction as the construction of the apparatus according to the first embodiment, except that phosphor particles 90a are deposited only on the entire upper surface of the pedestal 301 including the entire surfaces of the LED chip 10 with no phosphor particles deposited the peripheral region of the pedestal 301. This localized formation of the color conversion layer may be effected by spray-coating the phosphor particles onto the entire upper surface of the pedestal 301 including the entire surfaces of the LED chip 10. The spray-coating technique is disclosed in, for example, Jpn. Pat. Appln. KOKAI Publication No. 2003-318448.

Further, the localized formation of the color conversion layer may be effected by incorporating the phosphor particles in a portion (first portion) of the light-transmitting member, applying the resultant mixture dropwise to the entire upper surface of the pedestal 301 including the entire surfaces of the LED chip 10, and filling the remaining portion (second portion) of the light-transmitting member in the cup 201 of the package 20. In this case, an interface between the first and second portions of the light-transmitting member should not be created. For example, the applied first portion may or may not be semi-cured, and then the second portion is applied. Thereafter, the first and second portions can be cured.

The first portion of the light-transmitting member containing the phosphor particles can be applied by a printing method such as stencil printing or screen printing, as is disclosed in, for example, Jpn. Pat. Appln. KOKAI Publication No. 2000-223750 noted previously. When such a printing method is applied to the package having a reflector around the light-emitting device, the upper surface of the reflector is preferably flush with the surface on which the light-emitting device is placed, in order to for the mask used in printing not to interfere with the reflector.

Fifth Embodiment

Figure 7:
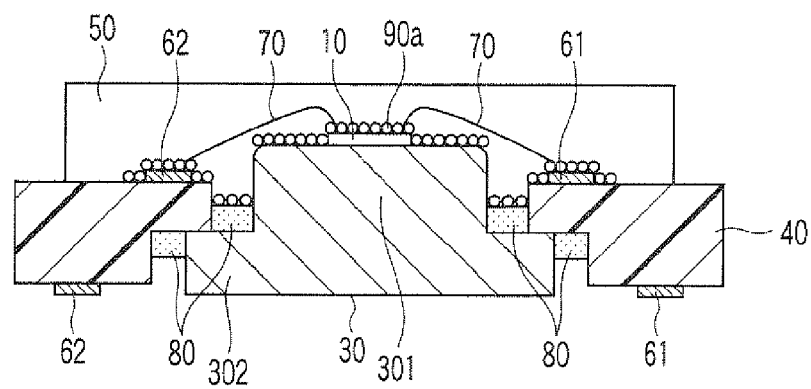
FIG. 7 is a side sectional view schematically illustrating a light-emitting apparatus according to a fifth embodiment of the present invention.

FIG. 7 is a side sectional view schematically illustrating a light-emitting apparatus according to a fifth embodiment of the present invention. The light-emitting apparatus according to the fifth embodiment is of the same construction as the construction of the apparatus according to the first embodiment, except that no cup is formed. Therefore, no side wall forming the cup is formed. The upper surface of the pedestal 301 is positioned higher than the upper surface of the substrate 40. The light-transmitting member 50 covers the light-emitting device 10, the color conversion layer 90 and metallic thin wires 70. The light emitting apparatus of this embodiment exhibits the same advantages as those of the apparatus of the first embodiment, and the outputted light can be distributed in a wider range.

Sixth Embodiment

The light-emitting apparatus according to a sixth embodiment is of the same construction as the construction of the apparatus according to the first embodiment, except that the bottom 30 and the side wall 40 are made of the same material. Examples of such a material include aluminum oxide (alumina), aluminum nitride and glass-epoxy.

The light-emitting apparatus according to the sixth embodiment exhibits the same advantages as those of the apparatus of the first embodiment, and can be manufactured in a simplified manner.

Figure 8:
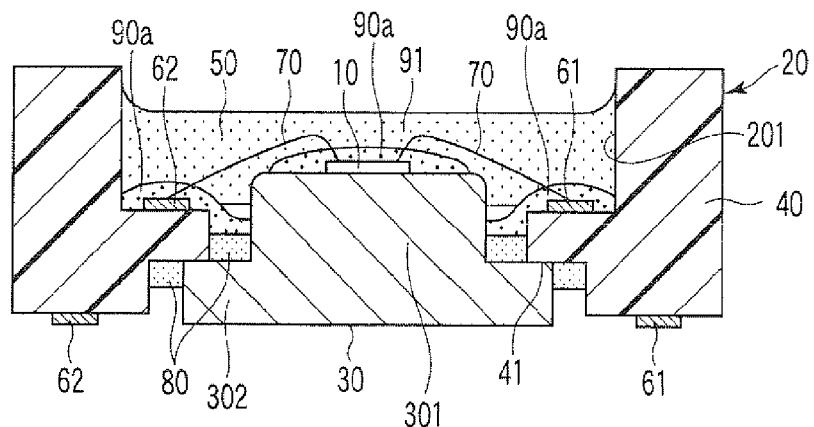
FIG. 8 is a side sectional view schematically illustrating a light-emitting apparatus according to a seventh embodiment of the present invention.

FIG. 8 is a side sectional view schematically illustrating a light-emitting apparatus according to a seventh embodiment of the present invention. The light-emitting apparatus according to the seventh embodiment is of the same construction as the construction of the apparatus according to the first embodiment, except that the light-transmitting member 50 contains a light-diffusing additive such as silica, alumina or titanium oxide. In this embodiment, the light-diffusing additive is, e.g., smaller in density (or specific gravity) than the phosphor particles. Such a light-transmitting member 50 can be prepared by filling a light-transmitting member uniformly containing the phosphor particles and the light-diffusing additive in the cup 201 of the package 20, and curing the light-transmitting member after the phosphor particles are precipitated and before substantially all of the light-transmitting additive is precipitated. The light-diffusing additive diffuses the light from the light-emitting device, increasing the field of view of the outputted light.

The light-diffusing additive may be applied to the light-emitting apparatuses according to the second to the sixth embodiments mentioned above.

Eighth Embodiment

Figure 9:
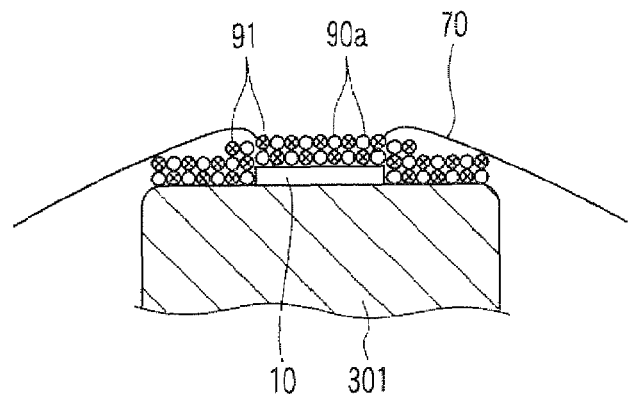
FIG. 9 illustrates a pedestal in a light-emitting apparatus according to an eighth embodiment of the present invention.

FIG. 9 illustrates a pedestal in a light-emitting apparatus according to an eighth embodiment of the present invention.

In an eighth embodiment, the color conversion layer 90 contains a light-diffusing additive 91 in addition to the phosphor particles 90a. In this embodiment, the light-diffusing additive 91 is, e.g., substantially the same as the phosphor particles 90a in particle size and specific gravity, such as silica, alumina or titanium oxide. When a light-transmitting member 50 containing the phosphor particles 90a and such light-diffusing additive 91 uniformly is applied, the phosphor particles 90a and the light-diffusing additive 91 are precipitated or settle down substantially simultaneously on the light-emitting device 10 on the pedestal 301, forming a color conversion layer 90 in which the phosphor particles 90a and the light-diffusing additive 91 are mixed and distributed uniformly, as shown in FIG. 9. In this case too, the light-diffusing additive 91 diffuses the light from the light-emitting device, increasing the field of view of the outputted light.

It is preferable that the light-diffusing additive 91 exhibits the same good wettability to the light-transmitting member 50 as the phosphor particles 90a. Such a light-diffusing additive 91 will be simultaneously deposited together with the phosphor particles 90a.

The light-diffusing additive 91 may be applied to the light-emitting apparatuses according to the second to the sixth embodiments mentioned above.

Ninth Embodiment

Figure 10:
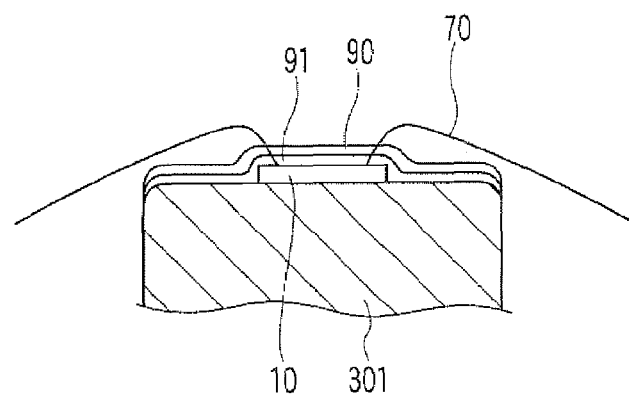
FIG. 10 illustrates a pedestal in a light-emitting apparatus according to a ninth embodiment of the present invention.

FIG. 10 illustrates a pedestal in a light-emitting apparatus according to a ninth embodiment of the present invention.

In a ninth embodiment, a layer of a light-diffusing additive 91 is formed under the color conversion layer 90. The light-diffusing additive is, e.g., larger in density (or specific gravity) than the phosphor particles, such as silica, alumina or titanium oxide. When a light-transmitting member 50 containing the phosphor particles and such light-diffusing additive is applied, the light-diffusing additive 91 is precipitated first to form the layer covering the bottom surface of the pedestal including the surface of the light-emitting device 10, and then the phosphor particles are precipitated or settle down on the layer of the light-diffusing additive 91, as shown in FIG. 10. As a result, the light-emitting device 10 assumes point sources of light, thereby increasing brightness and field of view of the outputted light.

The layer of the light-diffusing additive 91 and the color conversion layer 90 can also be prepared by a spray coating method or a printing method described with reference to the fourth embodiment.

Tenth Embodiment

Figure 11:
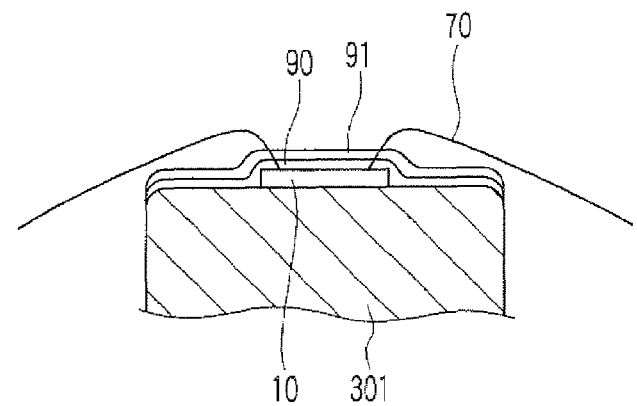
FIG. 11 illustrates a pedestal in a light-emitting apparatus according to a tenth embodiment of the present invention.

FIG. 11 illustrates a pedestal in a light-emitting apparatus according to a tenth embodiment of the present invention.

In a tenth embodiment, a layer of a light-diffusing additive 91 covers the color conversion layer 90. The light-diffusing additive is, e.g., smaller in density (or specific gravity) than the phosphor particles, such as silica, alumina or titanium oxide. When a light-transmitting member 50 containing the phosphor particles and such light-diffusing additive is applied, the phosphor particles are precipitated first to form the color conversion layer 90 covering the bottom surface of the pedestal 301 including the surface of the light-emitting device 10, and then the light-diffusing additive is precipitated or settled down on the color conversion layer 90, as shown in FIG. 11. As a result, the field of view of the outputted light is further improved.

The layer of the light-diffusing additive 91 and the color conversion layer 90 can also be prepared by a spray coating method or a printing method described with reference to the fourth embodiment.

With reference to the seventh to the tenth embodiment, it should be noted that the settling or sedimentation rate of a particle (a phosphor particle or a particle of a light-diffusing additive) in a liquid medium (e.g., a resin composition to provide the light-transmitting member 50) is governed by the radius of the particle and the density of the particle as is known in the art. In general, the lager the radius and/or the larger the density, the faster the particle is settled.

The present Invention with be described by way of an Example with reference to FIGS. 1 to 4. The present invention should not be limited by the Example.

EXAMPLE

In the light-emitting apparatus shown in FIGS. 1 to 4, a blue light-emitting device based on nitride semiconductors having a substantially square planar surface is used as the light-emitting device 10. On the upper surface of the device 10, two pairs of positive and negative electrodes are formed. On the lower surface of the device 10, an eutectic material comprising Au—Zn is partially coated. On a portion of the upper surface of the pedestal 301, silver is plated. The light-emitting device 10 is secured on the pedestal 301 by eutectically bonding the silver and the eutectic material. The electrodes of the light-emitting device are connected to the electrically conductive members 61 and 62 by metallic thin wires. A light-transmitting member containing YAG particles is filled in the cup 201 and the YAG particles 90a are settled down.

The present invention should not be limited to the embodiments described above, and may be modified in various ways within the scope of the claims. It should be noted that such modifications are also within the scope of the present invention.

The light-emitting apparatus of the present invention can be used as a light source of a backlight for a liquid crystal display screen of a mobile phone, character display panel used indoors or outdoors such as a full-color large scale graphic display device, a sensor such as a line sensor, an indicator, etc.

What is claimed is:

1. A light-emitting apparatus comprising:
a package comprising (a) a support having a central section and a peripheral section around the central section, the central section being raised upwardly from the peripheral section, providing a pedestal for supporting a light-emitting device, and (b) an insulating substrate having a central through-hole therein, an inner wall of the substrate that defines the central through-hole having an annular ledge protruding from a lower portion of the inner wall of the substrate with a side surface of the ledge being spaced apart from a peripheral surface of the pedestal, forming a recess, wherein the support is disposed in the central through-hole of the substrate such that an uppermost surface of the support is positioned higher than an upper surface of the ledge;
a light-emitting device secured on the uppermost surface of the pedestal and having electrodes;
electrically conductive members provided on a peripheral region of the package and electrically connected to the electrodes of the light-emitting device;
a color conversion layer covering the light-emitting device, the uppermost surface of the support and the upper surface of the ledge; and
a light-transmitting member formed in the package, sealing at least the light-emitting device together with the color conversion layer;
wherein the pedestal has its side surface at least partially exposed from the color conversion layer, and the color conversion layer is separated at the recess.

2. The light-emitting apparatus according to claim 1, wherein the color conversion layer is deposited substantially uniformly on the light-emitting device and on the peripheral section.

3. The light-emitting apparatus according to claim 1, wherein the color conversion layer comprises a portion of phosphor material which has been contained in the light-transmitting member and settled onto the light-emitting device.

4. The light-emitting apparatus according to claim 1, wherein
the light-emitting device is secured by a die-bonding member,
the die-bonding member covers a covering region extending from a lower edge of a side surface of the light-emitting device upwardly on a side surface of the device up to a position immediately below a position where a light-emitting layer of the light-emitting device is exposed, and
the color conversion layer covers a side surface of the device above the covering region, and also a side surface of the light-emitting layer.

5. The light-emitting apparatus according to claim 1, wherein a central region of the upper surface of the pedestal is recessed, the light-emitting device is placed in the recess in the pedestal, and the color conversion layer is deposited thicker on the side surface of the light-emitting device than on the upper surface of the light-emitting device.

6. The light-emitting apparatus according to claim 5, wherein the recess in the pedestal has a depth such that a light-emitting layer of the light-emitting device is positioned higher than the upper surface of the pedestal.

7. The light-emitting apparatus according to claim 1, wherein the color conversion layer is locally formed on the upper surface of the pedestal.

8. The light-emitting apparatus according to claim 1, wherein the support is made of a metallic material.

9. The light-emitting apparatus according to claim 1, wherein the color conversion layer comprises a mixture of a phosphor material effecting the color conversion and a light-diffusing additive.

10. The light-emitting apparatus according to claim 1, wherein the color conversion layer comprises a phosphor material and a light-diffusing additive having substantially the same particle size and specific gravity, which have been contained in the light-transmitting member and have been settled down.

11. A method of producing a light-emitting apparatus according to claim 1, the method comprising depositing a phosphor material which has been contained in the light-transmitting member by settling down the phosphor material onto the pedestal, forming the color conversion layer, such that the color conversion layer is discontinued at a step between the upper surface of the pedestal and the upper surface of the peripheral section, thereby exposing a portion of the side surface of the pedestal exposed from the color conversion layer.

12. The light-emitting apparatus according to claim 1, wherein the color conversion layer is formed also in the recess formed between the side surface of the ledge and the peripheral surface of the pedestal.

13. A light-emitting apparatus comprising:
a package comprising an insulating substrate including a central through-hole therein, an inner wall of the substrate that defines the central through-hole having an annular ledge protruding therefrom, and a support including a central projection and a peripheral section around the central section, the support being disposed in the through-hole such that a side surface of the ledge is spaced apart from a peripheral surface of the central projection, forming a recess, and an upper surface of the support is positioned higher than an upper surface of the ledge;
a light-emitting device on the upper surface of the central projection and including electrodes;
electrically conductive members provided on a peripheral region of the package and electrically connected to the electrodes of the light-emitting device;
a color conversion layer on the light-emitting device, the upper surface of the support and the upper surface of the ledge; and
a light-transmitting member on at least the light-emitting device and the color conversion layer,
wherein a side surface of the central projection is at least partially exposed from the color conversion layer, and the color conversion layer is separated at the recess.

14. The light-emitting apparatus according to claim 13, further comprising:
a recess formed in the upper surface of the central projection, wherein the light-emitting device is disposed in the recess.

15. The light-emitting apparatus according to claim 13, wherein the insulating substrate comprises multiple laminated substrate layers.

16. The light-emitting apparatus according to claim 13, wherein the support comprises a metallic material.

17. The light-emitting apparatus according to claim 13, further comprising:
a die bonding member securing the light-emitting device to the central projection.

18. The light-emitting apparatus according to claim 13, wherein the light-emitting member comprises a light-diffusing additive.

19. The light-emitting apparatus according to claim 13, wherein the color conversion layer comprises a light-diffusing additive.

* * * * *